(12) United States Patent
Kataoka et al.

(10) Patent No.: US 7,749,351 B2
(45) Date of Patent: Jul. 6, 2010

(54) METHOD OF PRODUCING SOLAR CELL MODULE

(75) Inventors: Ichiro Kataoka, Nara (JP); Akiharu Takabayashi, Nara (JP); Hidenori Shiotsuka, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 1245 days.

(21) Appl. No.: 10/731,476

(22) Filed: Dec. 10, 2003

(65) Prior Publication Data

US 2004/0171187 A1 Sep. 2, 2004

(30) Foreign Application Priority Data

Dec. 13, 2002 (JP) ............... 2002-361707

(51) Int. Cl.
*B29C 65/00* (2006.01)
*H01L 31/00* (2006.01)

(52) U.S. Cl. ............ 156/285; 156/382; 156/289; 156/537; 136/244

(58) Field of Classification Search ............ 156/285, 156/286, 382, 289, 537; 136/244; 269/21
See application file for complete search history.

(56) References Cited

U.S. PATENT DOCUMENTS

| | | | | |
|---|---|---|---|---|
| 4,426,633 A | * | 1/1984 | Taylor ............ 338/25 |
| 5,578,141 A | | 11/1996 | Mori et al. ............ 136/251 |
| 5,660,646 A | | 8/1997 | Kataoka et al. ............ 136/251 |
| 5,684,325 A | | 11/1997 | Kataoka et al. ............ 257/433 |
| 5,718,772 A | | 2/1998 | Mori et al. ............ 136/251 |
| 5,800,631 A | | 9/1998 | Yamada et al. ............ 136/251 |
| 5,973,258 A | | 10/1999 | Shiotsuka et al. ............ 136/252 |
| 5,993,582 A | * | 11/1999 | Yoshino et al. ............ 156/104 |
| 6,007,650 A | | 12/1999 | Itoyama et al. ............ 156/87 |
| 6,034,323 A | | 3/2000 | Yamada et al. ............ 136/259 |
| 6,041,840 A | * | 3/2000 | Ogawa ............ 156/382 |
| 6,075,202 A | | 6/2000 | Mori et al. ............ 136/251 |
| 6,113,718 A | | 9/2000 | Yamada et al. ............ 156/78 |
| 6,127,622 A | * | 10/2000 | Yamada et al. ............ 136/251 |
| 6,133,522 A | | 10/2000 | Kataoka et al. ............ 136/259 |
| 6,149,757 A | * | 11/2000 | Chikaki et al. ............ 156/286 |
| 6,162,986 A | | 12/2000 | Shiotsuka et al. ............ 136/244 |
| 6,175,075 B1 | | 1/2001 | Shiotsuka et al. ............ 136/251 |
| 6,182,403 B1 | | 2/2001 | Mimura et al. ............ 52/173.3 |

(Continued)

FOREIGN PATENT DOCUMENTS

CA 2300828 1/2000

(Continued)

*Primary Examiner*—Jeffrey T Barton
(74) *Attorney, Agent, or Firm*—Fitzpatrick, Cella, Harper & Scinto

(57) ABSTRACT

There is disclosed a method of producing a solar cell module comprising the steps of: mounting a body to be laminated onto a tabular member, carrying in the body to be laminated along with the tabular member onto a heated mounting board; heat-bonding the body to be laminated by pressing with an expanding unit; carrying out the body to be laminated along with the tabular member from the mounting board after parting the expanding unit from the body to be laminated; and separating the body to be laminated from the tabular member. By using the method, a temperature of the body to be laminated does not increase rapidly and a foaming phenomenon is suppressed, thereby allowing manufacturing of the solar cell module with a high yield.

5 Claims, 3 Drawing Sheets

U.S. PATENT DOCUMENTS

| | | | |
|---|---|---|---|
| 6,218,609 B1 | 4/2001 | Mori et al. | 136/259 |
| 6,227,270 B1 | 5/2001 | Itoyama et al. | 156/382 |
| 6,245,987 B1 | 6/2001 | Shiomi et al. | 136/244 |
| 6,291,761 B1 | 9/2001 | Takada et al. | 136/244 |
| 6,307,145 B1 | 10/2001 | Kataoka et al. | 136/251 |
| 6,320,115 B1 | 11/2001 | Kataoka et al. | 136/251 |
| 6,369,316 B1 * | 4/2002 | Plessing et al. | 136/251 |
| 6,380,025 B1 | 4/2002 | Suzuki et al. | 438/238 |
| 6,414,236 B1 | 7/2002 | Kataoka et al. | 136/251 |
| 6,515,216 B2 | 2/2003 | Zenko et al. | 136/244 |
| 6,534,702 B1 | 3/2003 | Makita et al. | 136/244 |
| 6,546,535 B1 | 4/2003 | Nagao et al. | 716/11 |
| 6,613,973 B2 | 9/2003 | Mukai et al. | 136/255 |
| 6,653,549 B2 | 11/2003 | Matsushita et al. | 136/244 |
| 6,664,597 B2 | 12/2003 | Takeyama et al. | 257/347 |
| 6,676,459 B2 | 1/2004 | Mukai et al. | 439/884 |
| 6,693,237 B2 | 2/2004 | Zenko et al. | 136/251 |
| 6,703,555 B2 | 3/2004 | Takabayashi et al. | 136/244 |
| 2001/0054435 A1 | 12/2001 | Nagao et al. | 136/251 |
| 2002/0195138 A1 | 12/2002 | Itoyama et al. | 136/251 |
| 2003/0000566 A1 | 1/2003 | Matsushita et al. | 136/244 |
| 2003/0005955 A1 | 1/2003 | Shiotsuka et al. | 136/251 |
| 2003/0010373 A1 | 1/2003 | Tsuzuki et al. | 136/244 |
| 2003/0075211 A1 | 4/2003 | Makita et al. | 136/244 |
| 2003/0234038 A1 | 12/2003 | Kurokami et al. | 136/255 |
| 2004/0045595 A1 | 3/2004 | Makita et al. | 136/244 |

FOREIGN PATENT DOCUMENTS

| | | |
|---|---|---|
| JP | 5-55617 | 3/1993 |
| JP | 9-36405 | 2/1997 |
| JP | 9-51114 | 2/1997 |
| JP | 9-141743 | 6/1997 |
| JP | 10-95089 | 4/1998 |
| JP | 10-214987 | 8/1998 |
| JP | 2000-349309 | 12/2000 |
| JP | 2002-520820 | 7/2002 |

* cited by examiner

METHOD OF PRODUCING SOLAR CELL MODULE

BACKGROUND OF THE INVENTION

1. Field of the Invention

The present invention relates to a method of producing a solar cell module having a laminating step of sealing a photovoltaic device with a sealing member for protection of the photovoltaic device.

2. Related Background Art

There are various types of solar cell modules using crystalline silicon, polycrystalline silicon, microcrystalline silicon, amorphous silicon, compound semiconductor, or the like as a photovoltaic device. However, those photovoltaic devices, as they are, have no tolerance for usage under a harsh environment such as an outdoor usage. The reasons resides in that the photovoltaic device itself is liable to suffer from corrosion and easily broken by an external impact or the like.

Therefore, there is a need to protect the photovoltaic device by covering it with a sealing member. For the protection of the photovoltaic device, a laminating method of fastening the photovoltaic device between a surface member such as glass and a back surface member which have excellent weatherability, such as a fluororesin film through a sealing resin is most commonly adopted. Glass excels in weatherability and prevents passage of moisture, therefore being one of the best materials for a member covering the photovoltaic device, which is a semiconductor. Therefore, in most of the solar cell modules, glass is used for the surface member of a light receiving surface side.

On the other hand, advantages of a thin film solar cell such as being lightweight, impact resistant, and flexible cannot be exerted because glass covering brings about problems such as being 1) heavy, 2) inflexible, 3) weak against impact, and 4) high-cost.

Therefore, conventionally, a solar cell module making a full use of lightweight and flexible characteristics of the thin film solar cell by using a transparent fluoride polymer thin film such as a fluororesin film as the surface member is proposed.

Meanwhile, in order to produce such a solar cell module, an apparatus for laminating the photovoltaic devices, connected in series or in parallel, with a sealing member is used. Examples of such an apparatus include a laminating apparatus of so-called double vacuum chamber method having a chamber section composed of an upper chamber and a lower chamber parted by a diaphragm, and is disclosed in U.S. Pat. No. 6,149,757 (Japanese Patent Application Laid-Open No. H09-141743) entitled "Laminating apparatus", Japanese Patent Application Laid-Open No. H10-214987 entitled "Laminator of solar cell module and lamination method", U.S. Pat. No. 6,380,025 (Japanese Patent Application Laid-Open No. 2000-349309) entitled "Method of encapsulating a solar cell module", or the like.

The laminating apparatuses disclosed in the above-mentioned documents have the upper chamber provided with the diaphragm freely expanding downward and the lower chamber provided with a heater board, and the upper chamber and the lower chamber can be freely opened or closed. The apparatuses are configured to depressurize the upper chamber and the lower chamber while mounting a body to be laminated onto the heater board provided in the lower chamber, heat the body to be laminated, and introduce an atmospheric air into the upper chamber, to thereby laminate the body to be laminated by pressing the body to be laminated between a top surface of the heater board and the diaphragm.

FIG. 4 is a view showing an example of a laminator manufactured according to a conventional double vacuum chamber method. The laminator includes a lower chamber 201, an upper chamber 202, a diaphragm 203, a mounting board 204, a heater 205, exhaust ports 206 and 207, an O-ring 208, and a body to be laminated 209.

A laminating method for a solar cell module using this type of apparatus is performed in accordance with the steps described below. First, the body to be laminated 209 is mounted on the mounting board 204 of the lower chamber 201, and the upper chamber 202 is mounted on the lower chamber 201. Next, the upper chamber 202 and the lower chamber 201 are both evacuated; the upper chamber 202 is set back to an atmospheric pressure while evacuating the lower chamber 201; and the body to be laminated 209 is contact-bonded to the diaphragm 203. Then, the body to be laminated 209 is heat-bonded with heat from the heater 205.

Further, a solar cell module can be produced using a single vacuum chamber method as well. The single vacuum chamber method is the same as the double vacuum chamber method except that an upper chamber is not provided and is disclosed in U.S. Pat. Nos. 6,007,650 B and 6,227,270 B (Japanese Patent Application Laid-Open No. H09-51114) entitled "Vacuum laminating apparatus", U.S. Pat. No. 6,320,115 (Japanese Patent Application Laid-Open No. H09-36405) entitled "Solar cell module and a lamination method", or the like. An example of the apparatus is shown in FIG. 5. The apparatus includes a mounting board 301, a diaphragm 302, a heater 303, an exhaust port communicating with the outside 304, an O-ring 305, and a body to be laminated 306.

A laminating method for a solar cell module using this apparatus is performed in accordance with the steps described below. First, the body to be laminated 306 is mounted on the mounting board 301, and the diaphragm 302 is stacked thereon. Next, the chamber is evacuated through the exhaust port 304 and the diaphragm 302 is caused to be sucked to the mounting board 301, thereby the body to be laminated 306 is contact-bonded to the diaphragm 302. The exhaust port 304 communicates a space, which is between the diaphragm 306 and the mounting board 301 sealed by the O-ring 305, with the outside. Then, the body to be laminated 306 is heat-bonded with heat from the heater 303.

In the laminating methods for the solar cell module, the body to be laminated is heated by electrifying the heater after contact-bonding the body to be laminated with the diaphragm. However, when manufacturing the solar cell modules, the mounting board is heated all the time in most cases. This will allow a prompt start of heating of the body to be laminated concomitantly with mounting thereof on the mounting board. In case of conducting lamination repeatedly, there is no need to cool the mounting board every time, which allows an increase of productivity with an enhanced throughput.

However, in a conventional laminating method for a solar cell module, when a body to be laminated is mounted on a heated mounting board, the body to be laminated and the mounting board contact each other directly, thereby rapidly raising the temperature of the body to be laminated and rapidly decomposing a crosslinking agent in a sealing member. Bubbles from gas generated hereby remain in the sealing member, causing a problem of so-called foaming phenomenon.

In particular, recently, lowering of the cost of a solar cell module is highly demanded. In such a flow, attempts of markedly thinner and simpler sealing configurations compared to those in existence are made. However, the thinner the sealing member, the faster the rise in the temperature of the body to be laminated, and easier for the foaming phenomenon to occur.

In addition, for lowering the cost of a photovoltaic device itself, thin film solar cells such as a thin film polycrystalline silicon solar cell, a thin film microcrystalline silicon solar cell, an amorphous silicon solar cell, and a thin film compound semiconductor solar cell have attracted attention. However, those solar cells also bring about a problem of a rapid temperature rise of the body to be laminated due to thickness reduction, similarly to the sealing member.

On the other hand, with the diversification of the solar cell modules, there are cases of simultaneously laminating a large number of modules with a much smaller size than that of the mounting board. In such a case, there was a problem in that the body to be laminated initially mounted on the mounting board was heated more than necessary, causing a variation in module quality.

SUMMARY OF THE INVENTION

The present invention has been made in consideration of the conditions mentioned above. An object of the present invention is to provide a method of producing a solar cell module having a laminating step, in which a temperature of a body to be laminated is not rapidly raised when mounted on a heated mounting board and an foaming phenomenon of a sealing member is suppressed, thereby the solar cell module can be manufactured with a high yield.

In order to achieve the above-mentioned object, according to the present invention, there is provided a method of producing a solar cell module having a laminating step, in which a body to be laminated comprising photovoltaic devices and a sealing member is mounted onto a mounting board heated at a predetermined temperature and the body to be laminated is heat-bonded by pressing with pressing means, the method comprising the steps of:

mounting the body to be laminated on a tabular member;

carrying in the body to be laminated along with the tabular member onto the mounting board;

heat-bonding the body to be laminated by pressing using the pressing means;

carrying out the body to be laminated along with the tabular member from the mounting board after parting the pressing means from the body to be laminated; and separating the body to be laminated from the tabular member.

In the method of producing a solar cell module, it is preferable to arrange a release sheet having a surface in an irregular form between the tabular member and the body to be laminated.

Alternatively, the tabular member may have a surface in an irregular form, and the release sheet may be configured to follow the irregular form.

Alternatively, the tabular member may have a surface in an irregular form, and the surface of the tabular member may be subjected to release treatment.

In addition, it is preferable that the mounting board is heated at a temperature of 140° C. to 180° C.

Further, it is preferable that organic peroxide is blended as a crosslinking agent in at least one of the sealing members, and an 1-hour half-life temperature of the organic peroxide is 125° C. or less.

Further, it is preferable that the pressing means is cooled by cooling means.

DESCRIPTION OF THE PREFERRED EMBODIMENTS

Figure 1:
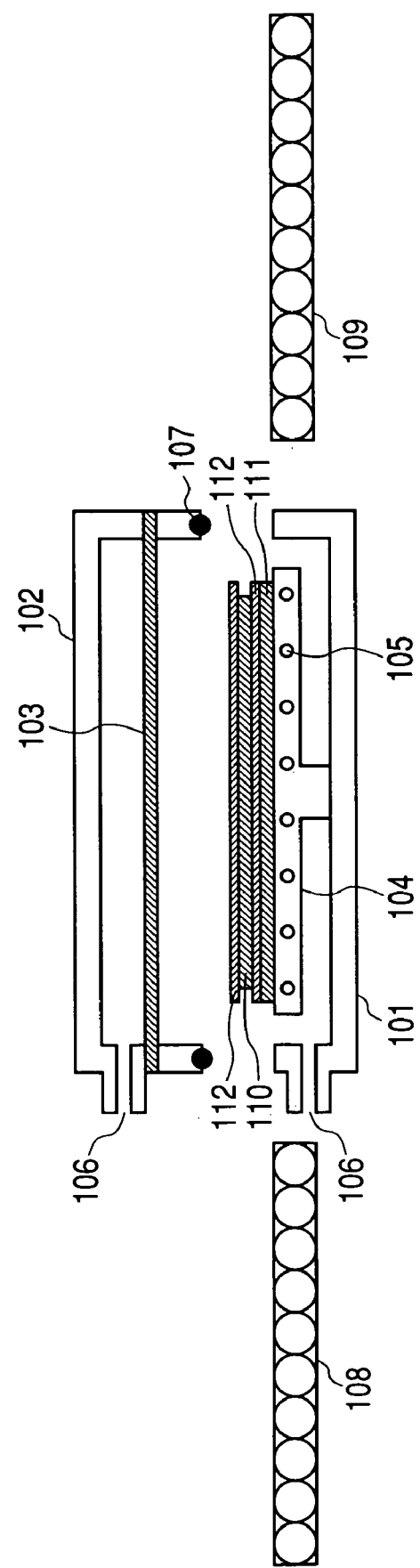
FIG. 1 is a schematic view showing an example of a laminating apparatus used in a method of producing a solar cell module according to the present invention.

Hereinbelow, an embodiment of the present invention is described by referring to the drawings. However, the present invention is not restricted to the embodiment of the present invention.

FIG. 1 is a schematic view showing an example of a laminating apparatus used in a laminating step which is preferably used in a method of producing a solar cell module according to the present invention. The laminating apparatus includes a lower chamber 101, an upper chamber 102, a diaphragm as a pressing means 103, a mounting board 104, a heater 105, an exhaust port 106, an O-ring 107, a carry-in means for the body to be laminated 108, a carry-out means for the body to be laminated 109; a body to be laminated 110, a tabular member 111, and a release sheet 112.

A laminating method preferably used in the method of producing a solar cell module according to the present invention will be specifically described more, referring to FIG. 1.

First, the tabular member 111 is mounted onto the carry-in means 108. A material of the tabular member 111 may be suitably selected from metals, plastics, or the like. However, considering thermal conductivity, metal plates such as iron, aluminum, and copper may preferably be used.

It is preferable to arrange the release sheet 112 above the tabular member 111 such that the body to be laminated 110 may be easily separated from the tabular member 111 after lamination. Further, it is more preferable that a surface of the release sheet 112 be in an irregular form. With the surface of the release sheet 112 being in an irregular form, an air path is formed between the release sheet 112 and the body to be laminated 110 mounted thereon, allowing efficient ejection of air from the body to be laminated 110 during evacuation operation described later. Such a release sheet 112 include, for example, an embossed fluororesin sheet, a glass cloth sheet impregnated with a fluororesin, or the like.

In addition to the above, another preferable embodiment is to form the surface of the tabular member 111 in an irregular form and to subject the surface to release treatment. It is also possible to arrange a thin film such as a fluororesin above the tabular member 111, following the irregular form thereof.

Next, the body to be laminated 110 is mounted on the tabular member 111 through the release sheet 112. The term "the body to be laminated" 110 used herein is one stacked with a photovoltaic device and a sealing member. The release sheet 112 is further stacked thereon as appropriate. This is to prevent a melted sealing member from bonding to the diaphragm.

Then, the body to be laminated 110 is carried into the laminating apparatus along with the tabular member 111 to be placed on the mounting board 104. The mounting board 104 at this point is heated beforehand by the built-in heater 105. The temperature for the heating is determined to allow the chemical reaction to proceed smoothly in case the sealing member melts and a chemical reaction such as crosslinking is further required. The temperature is desirably 140° C. to 180° C. but is more desirably 160° C. to 180° C. to shorten the time for the lamination. If the temperature of the mounting board 104 exceeds 180° C., a foaming phenomenon becomes prominent, causing difficulty in suppressing the phenomenon even in the present invention.

Then, the upper chamber 102 is mounted on the lower chamber 101. The upper chamber 102 and the lower chamber 101 are simultaneously evacuated, and at a time a degree of vacuum reaches a certain value, the upper chamber 102 is set back to an atmospheric pressure while the lower chamber 101 remains evacuated. The diaphragm 103 as a pressing means is expanded to press the body to be laminated 110. During this time, air inside the body to be laminated 110 is ejected while the sealing member melts to bond and integrate with the body to be laminated 110, thereby completing the lamination. After, the lower chamber 101 is set back to an atmospheric pressure, the upper chamber 102 is removed, and the body to be laminated 110 is carried out along with the tabular member 111 to be placed on the carry-out means 109.

The body to be laminated 110 carried out is cooled as appropriate using a fan or the like, and then is separated from the tabular member 111.

In case of conducting the next lamination successively, the body to be laminated 110 is mounted onto the tabular member 111 again and the step described above is repeated. In this case, it is preferable to conduct the next lamination after cooling the diaphragm 103 by cooling means. The reason is that if the heated diaphragm 103 is contact-bonded to the body to be laminated 110, the body to be laminated 110 is heated undesirably. The cooling means is not particularly restricted, and an air blow using a fan or the like may be selected as appropriate.

Figure 2:
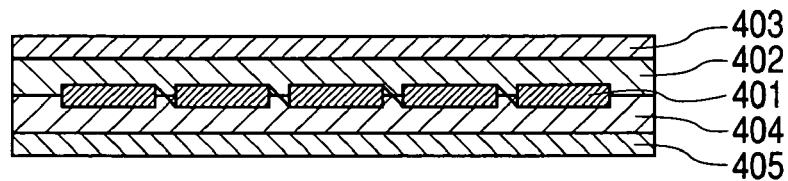
FIG. 2 is a schematic view showing an example of a solar cell module produced using a method of producing a solar cell module according to the present invention.

FIG. 2 is a view showing an example of a solar cell module produced using the method of producing a solar cell module according to the present invention. The solar cell module includes a photovoltaic device 401, a transparent sealing resin 402 to be used for a surface of the photovoltaic device, a transparent surface member 403 located at the outermost surface, a sealing resin 404 to be used for a back surface of the photovoltaic device, and a back surface member 405.

Light from the outside enters the solar cell module from the surface member 403 and reaches the photovoltaic device 401. An electromotive force generated therefrom is abstracted to the outside from an output terminal (not shown).

As the photovoltaic device 401, a variety of known devices such as 1) a crystalline silicon solar cell, 2) a polycrystalline silicon solar cell, 3) a microcrystalline silicon solar cell, 4) an amorphous silicon solar cell, 5) a copper indium selenide solar cell, and 6) a compound semiconductor solar cell may be selected and used according to the purpose. Those photovoltaic devices are connected in series or in parallel according to a desired voltage or current. Aside from the above, a desired voltage or current may be obtained by integrating the photovoltaic devices on an insulated substrate.

The surface sealing material 402 is required for protecting the photovoltaic device from a harsh, an external environment such as a temperature change, humidity, and impact by coating the irregularities of the photovoltaic device 401 with a resin, and in addition, for ensuring bonding of a surface member and the photovoltaic device. Therefore, weatherability, adhesiveness, filling property, thermal resistance, low temperature resistance, and impact resistance are required for the surface sealing member 402. Resins meeting those requirements include an ethylene-vinyl acetate copolymer (EVA), an ethylene-methyl acrylate copolymer (EMA), an ethylene-ethyl acrylate copolymer (EEA), polyolefin resins such as a butyral resin, a urethane resin, a silicone resin, a fluororesin, and the like.

Of those, EVA has balanced physical properties applicable to a solar cell and is preferably used. However, deformation and creep easily occur under a high temperature condition when used as it is because of its low heat distortion temperature. Therefore, it is desirable to enhance thermal resistance by crosslinking. EVA is generally crosslinked with organic peroxides. Crosslinking with the organic peroxides is conducted by abstraction of a hydrogen atom or a halogen atom in a resin by a free radical generated from the organic peroxides and by formation of a carbon-carbon bond. Heat decomposition, redox decomposition, and ion decomposition are known as activation methods of the organic peroxides. Generally, the heat decomposition method is preferably conducted.

It is possible to combine the organic peroxides described above with the sealing member and conduct crosslinking and heat-bonding thereof while pressurizing and heating under vacuum. A heating temperature and time can be determined by heat decomposition temperature property of each of the organic peroxides. Generally, heating and pressurizing are completed at a temperature and time of which the reaction proceeds to a thermal decomposition of 90% or more, more preferably 95% or more. A gel content may be measured to confirm the crosslinking of the sealing material resin, and it is desirable to conduct crosslinking so that the gel content becomes 70 wt % or more to prevent the deformation of the sealing resin under a high temperature condition.

An 1-hour half-life temperature is an indicator representing a heat decomposition property of an organic peroxide used as a crosslinking agent. This is a temperature at which half of the total amount pyrolytically decomposes in 1 hour, and smaller the value, more liable the heat decomposition occurs at a lower temperature. In other words, in a case of decomposing at the same temperature, a decomposition rate becomes larger. Therefore, in order to shorten a lamination time, an organic peroxide with a low 1-hour half-life temperature may be preferably used as a crosslinking agent. On the other hand, a rate of gas formation by the decomposition becomes larger, which causes bubbles liable to remain within the sealing material resin. Therefore, an organic peroxide with an 1-hour half-life temperature of about 140° C. is generally used.

However, in the present invention, a module is configured to suppress a rapid rise of temperature of the body to be laminated 110 as described above, so that the decomposition rate of the organic peroxide at the time of initial heating can be suppressed. Therefore, a shortening of the lamination time can be attempted using the organic peroxide with a low 1-hour half-life temperature. The 1-hour half-life temperature of the organic peroxide preferably used in the laminating method of a solar cell module according to the present invention is 125° C. or less, more preferably 115° C. or less.

The surface member 403, located at the outermost layer, requires properties to ensure long-term reliability against outside weathering of a solar cell module including transparency, weatherability, stain resistance, and mechanical strength. For example, a low-iron tempered glass, a fluororesin film, an acrylic resin film, or the like may be used. The low-iron tempered glass excels in transparency, is strong against impact and is uneasily broken, thereby is widely used as a surface member of a solar cell module.

However, recently, lightweight property and flexibility are often required for a solar cell module. In order to meet such requirement, a resin film is used as a surface member. A fluororesin film is preferably used owing to its excellent weatherability and stain resistance. Specifically, examples of a fluororesin film include a poly (vinylidene) fluoride resin, a poly (vinyl) fluoride resin, a tetrafluoroethylene-ethylene copolymer, and the like. From a viewpoint of weatherability, the poly (vinylidene) fluoride is excellent. However, from a viewpoint of compatibility of weatherability and mechanical strength and of transparency, the tetrafluoroethylene-ethylene copolymer is excellent.

The back surface member 405 is used to maintain electrical insulation of the photovoltaic device 401 from a conductive substrate thereof and the outside. As a material for the back surface member 405, preferably used is a material ensuring sufficient electrical insulation from the conductive substrate, and excelling in long-term durability as well as flexibility such as being tolerant of thermal expansion and thermal shrinkage. A film preferably used includes nylon and polyethylene terephthalate.

The back surface sealing material 404 enables bonding of the photovoltaic device 401 with the back surface member 405. A material for the back surface sealing material 404 preferably used is a material ensuring sufficient adhesiveness with the photovoltaic device 401, excelling in long-term durability as well as flexibility such as being tolerant of thermal expansion and thermal shrinkage. Examples of the material preferably used include EVA, a thermoplastic resin such as polyvinyl butyral, a two-sided tape, and an epoxy adhesive having flexibility. The same material as that of the surface sealing material 402 can be certainly used, which is a typical case. In other words, the EVA described above is generally used for the back surface as well.

According to the laminating method preferably used for the method of producing a solar cell module of the present invention, even if mounting the body to be laminated onto the heated mounting board, the body to be laminated contacts therewith indirectly via the tabular member. Therefore, the temperature of the body to be laminated does not rise rapidly and the foaming phenomenon of the sealing member is suppressed, thereby enabling manufacturing of the solar cell module with a high yield.

Further, the foaming phenomenon of the sealing member may be further suppressed by forming an air path between the body to be laminated and the tabular member. The air path is formed by: arranging the release sheet having a surface in an irregular form between the tabular member and the body to be laminated; subjecting a surface of the tabular member with an irregular form to release treatment so that the body to be laminated is separable; or arranging the release film to follow the irregular form of the surface of the tabular member.

Further, the temperature of the mounting board is 140° C. to 180° C. and/or an organic peroxide as a crosslinking agent is blended in at least one of the sealing members, and the 1-hour half-life temperature of the organic peroxide is 125° C. or less, thereby allowing the lamination time to be shortened while suppressing a foaming phenomenon.

Then, by cooling the diaphragm by cooling means, a temperature rise of the diaphragm can be suppressed even in consecutive lamination operation. Therefore, the body to be laminated is not heated by the heat of the diaphragm during contact-bonding of the body to be laminated, and the foaming phenomenon of the sealing member can be assuredly suppressed.

EXAMPLE

Hereinbelow, Example of a laminating method preferably used for a method of producing a solar cell module according to the present invention will be described in detail by referring to FIG. 1. The laminating method of the present invention is not in any way restricted to Example described below, and can be diversely altered within a range of the scope of the present invention.

As shown in FIG. 1, as a release sheet 112, a glass cloth sheet impregnated with a fluororesin, of a thickness of 0.5 mm, and having a surface in an irregular form was placed on an aluminum plate with a thickness of 1 mm as a tabular member 111. A body to be laminated 110 stacked with photovoltaic devices and a sealing member was mounted thereon.

A configuration of the body to be laminated 110 used here included a fluororesin film/an EVA sheet/photovoltaic devices/an EVA sheet/a PET film in this order from the top. The EVA sheet used had a thickness of 0.4 mm and contains an organic peroxide with an 1-hour half-life temperature of 112° C. as a crosslinking agent.

Further, after superposing the fluororesin sheet as a release sheet 112 on the top, the body to be laminated was carried into a laminating apparatus to be placed onto a mounting board 104, heated to 160° C. in advance by a built-in heater 105, using a roller conveyer as a carry-in means 108.

Next, an upper chamber 102 and a lower chamber 101 were sealed, and both chambers were evacuated to $6.7 \times 10^2$ Pa (5 Torr) or less. The upper chamber 102 was set back to an atmospheric pressure, and a diaphragm 103 was expanded downward to press the body to be laminated 110, and this state was maintained for 15 minutes. Through this, air inside the body to be laminated was ejected, and the EVA sheet melted to bond and sealed the photovoltaic devices. Further, a crosslinking reaction of EVA proceeded by the decomposition of the organic peroxide, and the EVA became a cured compound having excellent thermal resistance and adhesiveness as a sealing member of a solar cell module.

Then, the lower chamber 101 was set back to an atmospheric pressure and the upper chamber 102 was removed. Then the finished solar cell module along with the aluminum plate 111 was carried out using the roller conveyer as a carry-out means 109.

The solar cell module on the roller conveyer 109 was cooled using a fan and then the fluororesin sheet 112 on the upper side was removed. The completed solar cell module was separated from the glass cloth sheet 112 impregnated with a fluororesin.

Similar steps were repeated to conduct successive production of the solar cell modules. In such cases, the diaphragm 103 was cooled using a fan until the upper chamber 102 and the lower chamber 101 were sealed.

The solar cell module prepared using the above steps had only little bubbles remained within the sealing member, and a high yield could be actualized.

Comparative Example

In order to compare with Example described above, an experiment was conducted following the same laminating method as Example except that a tabular member 111 was not used. As a result, much bubbles remained within a sealing material, and a solar cell module was not seemingly preferable.

Figure 3:
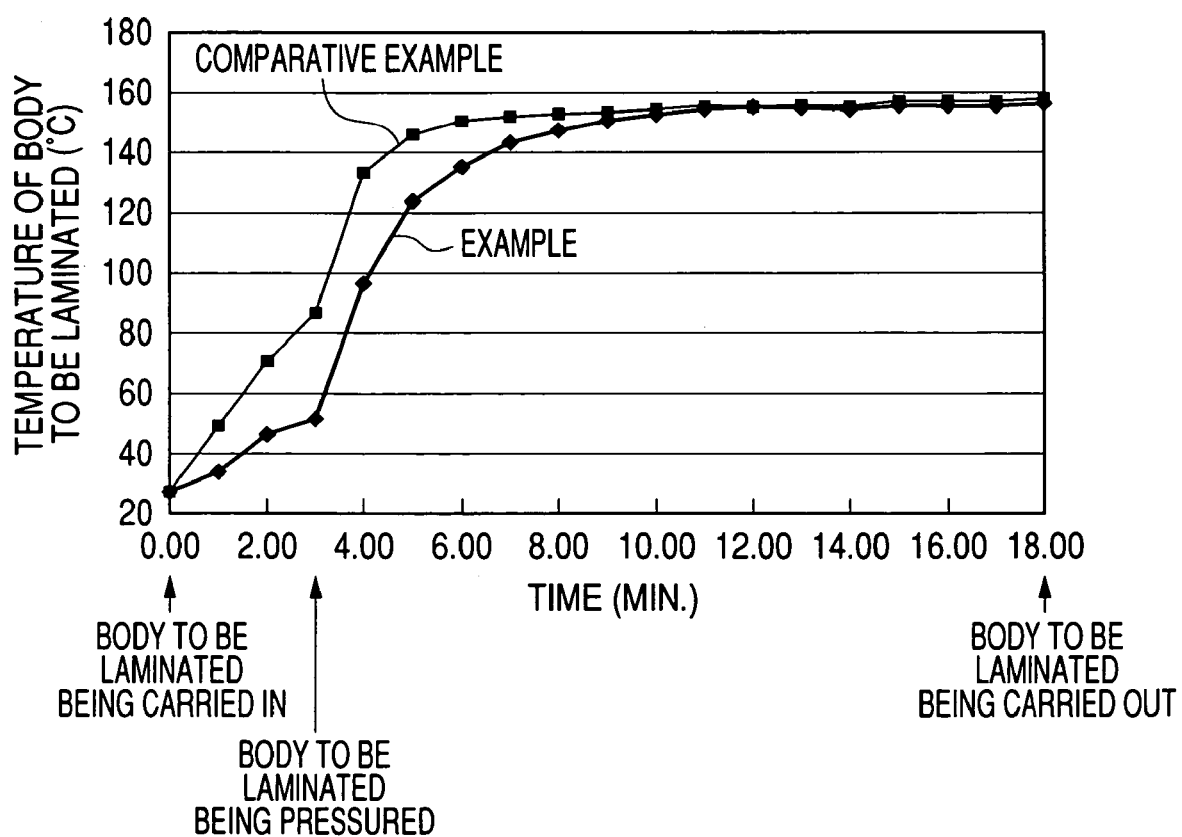
FIG. 3 is an explanatory diagram showing temperatures of bodies to be laminated in laminating steps according to Example and Comparative Example of the present invention.
Figure 4:
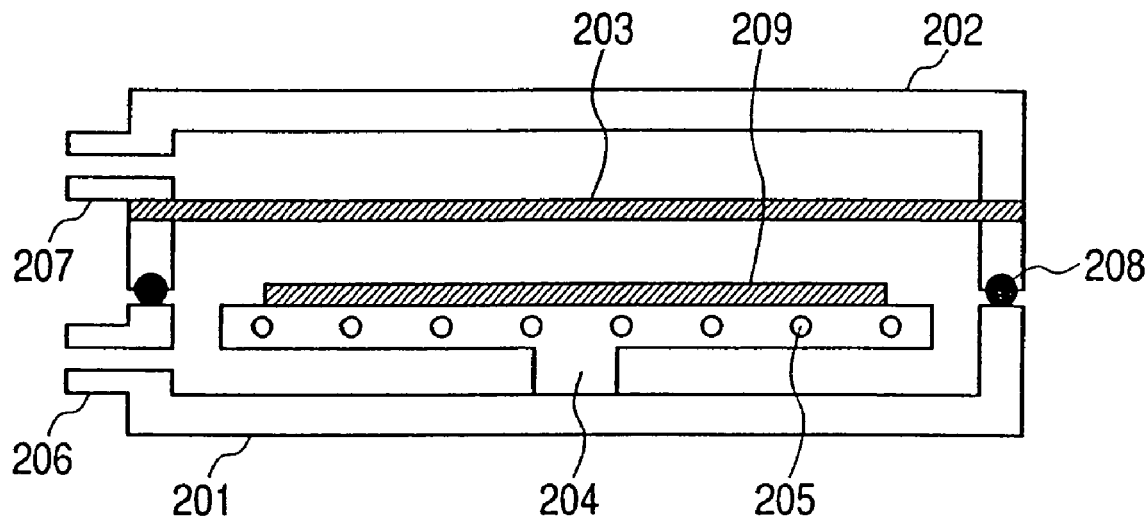
FIG. 4 is a schematic view showing an example of a laminating apparatus of a conventional double vacuum chamber method.
Figure 5:
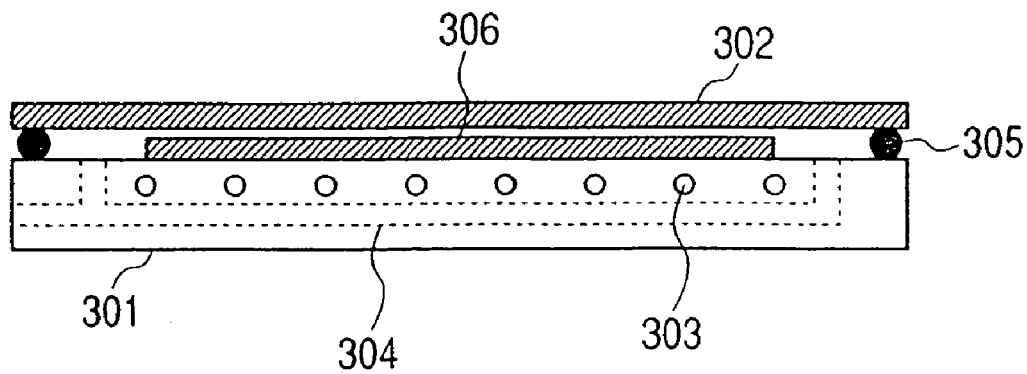
FIG. 5 is a schematic view showing an example of a laminating apparatus of a conventional single vacuum chamber method.

FIG. 3 is an explanatory diagram showing temperatures of the bodies to be laminated of Example and Comparative Example during a laminating step. As shown in FIG. 3, it can be recognized that a temperature rise from just after pressing of the body to be laminated by the diaphragm is extremely large in Comparative Example. In other words, since the tabular member is not present in Comparative Example, the heat of a mounting board rapidly traveled to the body to be laminated and the temperature of the body to be laminated rapidly increased. Specifically, as in a configuration of the bodies to be laminated used in Example and Comparative Example of the present invention, in which the photovoltaic devices are sealed with only a thin resin film, heat capacity of the body to be laminated is small and it is assumed that such tendency becomes conspicuous. As a result, the organic peroxide contained in an EVA sheet decomposes at once, and gas generated accompanying the decomposition cannot be dissolved in EVA and cannot be ejected even by a vacuum, thereby remains in EVA as bubbles.

On the other hand, in Example of the present invention, the final temperature reached, at the same time as the temperature rise is moderately suppressed just after pressing of the body to be laminated by the diaphragm, is comparable to that of Comparative Example. It is considered that sufficient crosslinking reaction can be proceeded while suppressing rapid decomposition of the organic peroxide.

As described above, according to the preferable embodiment of the present invention, the body to be laminated is mounted onto the heated mounting board through the tabular member, so that the temperature of the body to be laminated does not increase rapidly, thereby exerting an excellent effect that the solar cell module can be manufactured with a high yield while suppressing the foaming phenomenon.

What is claimed is:

1. A method of producing a solar cell module having a laminating step, in which a body to be laminated comprising of photovoltaic devices and a sealing member is mounted on a mounting board heated at a predetermined temperature and the body to be laminated is heat-bonded by pressing with a diaphragm, the method comprising the steps of:

mounting the body to be laminated on a tabular member;
carrying in the body to be laminated along with the tabular member onto the mounting board;
heat-bonding the body to be laminated by pressing using the diaphragm;
carrying out the body to be laminated along with the tabular member from the mounting board after separating the diaphragm from the body to be laminated; and
separating the body to be laminated from the tabular member,
wherein the diaphragm is provided opposite to the mounting board heated at a predetermined temperature, and the diaphragm applies pressure on the body to be laminated which is sandwiched between the diaphragm and the mounting board,
wherein the diaphragm is directly cooled by a fan after carrying out the body,
wherein another body to be laminated is carried in along with another tabular member onto the mounting board after cooling the diaphragm, and
wherein a release sheet is arranged between the tabular member and the body to be laminated, and the release sheet has an irregular form on a surface for allowing efficient ejection of air from the body.

2. The method of producing a solar cell module according to claim 1, wherein the tabular member has an irregular form on a surface while the surface of the tabular member is subjected to release treatment to allow separation of the body to be laminated, or a release film following the irregular form is arranged on the surface of the tabular member.

3. The method of producing a solar cell module according to claim 1, wherein a temperature of the mounting board is 160° C. or more.

4. The method of producing a solar cell module according to claim 1, wherein organic peroxide is blended as a crosslinking agent in at least one of the sealing members, and a 1-hour half-life temperature of the organic peroxide is 115° C. or less.

5. The method of producing a solar cell module according to claim 1, wherein the release sheet is impregnated with a fluororesin.

* * * * *